(12) United States Patent
Hanabe

(10) Patent No.: US 8,866,277 B2
(45) Date of Patent: Oct. 21, 2014

(54) PACKAGE SUBSTRATE, MODULE AND ELECTRIC/ELECTRONIC DEVICES USING THE SAME

(75) Inventor: Mitsuhiro Hanabe, Kanagawa (JP)

(73) Assignee: Sony Corporation (JP)

( * ) Notice: Subject to any disclaimer, the term of this patent is extended or adjusted under 35 U.S.C. 154(b) by 369 days.

(21) Appl. No.: 13/231,518

(22) Filed: Sep. 13, 2011

(65) Prior Publication Data

US 2012/0068322 A1   Mar. 22, 2012

(30) Foreign Application Priority Data

Sep. 22, 2010 (JP) ................................ 2010-211641

(51) Int. Cl.
*H01L 29/76* (2006.01)
*H01L 23/498* (2006.01)
*H01L 23/50* (2006.01)

(52) U.S. Cl.
CPC . *H01L 23/49827* (2013.01); *H01L 2224/48091* (2013.01); *H01L 23/49822* (2013.01); *H01L 23/49838* (2013.01); *H01L 23/50* (2013.01); *H01L 2224/16225* (2013.01); *H01L 2224/16227* (2013.01); *H01L 2924/15311* (2013.01)
USPC .................... 257/676; 257/E23.036

(58) Field of Classification Search
CPC ............................. H01L 2224/48091
USPC ......................... 257/676, E23.036
See application file for complete search history.

(56) References Cited

U.S. PATENT DOCUMENTS 5,665,473 A * 9/1997 Okoshi et al. ................. 428/457
2008/0290495 A1* 11/2008 Uematsu et al. .............. 257/691

FOREIGN PATENT DOCUMENTS

JP    2007-221014     8/2007
JP    2007221014   *  8/2007

* cited by examiner

*Primary Examiner* — Edward Wojciechowicz
(74) *Attorney, Agent, or Firm* — Sheridan Ross P.C.

(57) ABSTRACT

A package substrate includes: a first conductive layer having plural first terminal pattern portions connected to a semiconductor part loaded on a first principal surface through plural first external connection conductors, which is formed on the first principal surface; a second conductive layer having plural second terminal patterns connected to a system substrate mounted on a second principal surface opposite to the first principal surface through a second external connection conductor, which is formed on the second principal surface; an intermediate conductive layer formed between the first conductive layer and the second conductive layer; interlayer insulating layers formed between the first conductive layer and the intermediate conductive layer as well as between the second conductive layer and the intermediate conductive layer; and plural interlayer connection conductors stacked for connecting between the first conductive layer and the second conductive layer so as to pierce through the interlayer insulating layers.

18 Claims, 12 Drawing Sheets

[EMBODIMENT]
PACKAGE SUBSTRATE ON WHICH SEMICONDUCTOR CHIP IS LOADED

STRUCTURE OF PACKAGE SUBSTRATE

STRUCTURE OF PACKAGE SUBSTRATE

PACKAGE SUBSTRATE, MODULE AND ELECTRIC/ELECTRONIC DEVICES USING THE SAME

FIELD

The present disclosure relates to a package substrate on which a semiconductor part is loaded, and particularly relates to a package substrate capable of alleviating large current concentration, a module and an electric/electronic device using the same.

BACKGROUND

In order to realize reduction in size and thickness as well as enhancement of functionality of electronic devices such as a computer, a communication device and a display device, various miniaturized and highly-integrated semiconductor chips (IC), for example, LSI chips such as a microprocessor are used. These semiconductor chips include ones which consume large current.

The semiconductor chip is loaded and mounted on a substrate called, for example, a package substrate or an interposer (intermediate) substrate, which is loaded on a system board (a system substrate, a motherboard) to be part of an electronic circuit in an electronic device.

The semiconductor chip is flip-chip mounted on the package substrate by bump electrodes arranged on a bottom surface in an array state, and the package substrate is loaded on the system board by, for example, a BGA (Ball Grid Array) and so on.

As the package substrate, a multilayer wiring substrate is used, in which conductive layers such as a signal wiring pattern layer, a power supply layer and a ground layer are stacked through interlayer insulating layers and the conductive layers are connected to one another by vias, through holes and so on which are formed so as to pierce through the interlayer insulating layers. The multilayer wiring substrate is fabricated by using, for example, a build-up method. The power supply layer and the ground layer of the package substrate are generally connected to upper and lower conductive layers by a large number of vias for improving electric characteristics such as loop inductance.

As a related-art documents concerning the multilayer wiring substrate to which electronic parts are loaded, for example, there is JP-A-2007-221014 (Paragraph 0008 to 0015, FIG. 1, FIG. 2) (Patent Document 1) entitled "Multilayer wiring substrate structure", which wrote the following description.

As the major characteristics of the technology in Patent Document 1, a plurality of reinforcement vias to be current flow paths are formed around a through hole in which large current flows, and one or plural conductive patterns electrically connecting the through hole to the reinforcement vias are formed at a substrate outer layer and a substrate inner layer, thereby distributing current to surrounding reinforcement vias so that current is not concentrated only in the through hole, and at the same time, the through hole can be heated to a temperature sufficient for melting solder in a process of soldering an electrode terminal to the through hole.

When current flows in one or a small number of through holes in a concentrated manner, heat is generated at a connecting portion between the through hole and the power supply layer. However, the addition of the reinforcement vias disperses generated heat in the through hole and the reinforcement vias as current flows in a dispersed manner, which suppresses temperature increase.

SUMMARY

FIG. 11 and FIG. 12 are views for explaining a structure example of a package substrate in related art, which are perspective views each including a cross section by cutting out part of a semiconductor chip 8 and views showing examples of cross-sectional structures of a package substrate 5 shown in the same manner as later-described FIG. 1.

In FIGS. 11, 12, a cut-out portion on part of the semiconductor chip 8 is the same portion as a cut-out portion 8a on part of a semiconductor chip shown by dotted lines in FIG. 2. There are shown power supply patterns 3a-2, 3a-3 and a ground pattern 3a-1 forming part of a wiring layer 3a formed on a surface layer, internal wiring layers 3b to 3e and a wiring layer 3f in which a not-shown power supply pattern and a ground pattern are formed. Power supply current at which the semiconductor chip 8 is driven flows in the power supply patterns 3a-2, 3a-3, and ground current at which the semiconductor chip 8 is driven flows in the ground pattern 3a-1.

As shown in FIGS. 11, 12, an L1 layer and an L6 layer are outermost conductive layers in the multilayer substrate, the conductive layer of the L1 layer includes the power supply patterns 3a-2, 3a-3 and the ground pattern 3a-1, and the conductive layer of the L6 layer shows a wiring layer in which the power supply pattern and the ground pattern (not shown) are formed.

Conductive layers of an L2 layer to an L5 layer are internal power supply layers in the multilayer substrate, which are wiring layers in which power supply current at which the semiconductor chip 8 is driven flows. The conductive layers of the L1 layer to the L6 layer are stacked through interlayer insulating layers 4a to 4e. The semiconductor chip 8 is flip-chip connected to terminal pattern portions of the ground pattern 3a-1 and terminal pattern portions of the ground pattern 3a-2 through a bump array 7, which is mounted on one principal surface of the package substrate 5. The other principal surface opposite to one surface of the package substrate 5 is connected to a system board (a system substrate, a motherboard) through a BGA 2 and loaded thereon.

In the example shown in FIG. 11, vias 6 piercing through each of the interlayer insulating layers 4a to 4e are formed, and power supply current flowing through the BGA 2 flows to the semiconductor chip 8 through the vias 6, the terminal pattern portions of the power supply pattern 3a-2 and the bump array 7.

In the example shown in FIG. 12, through holes 9 are formed instead of the vias 6 in the interlayer insulating layer 4c shown in FIG. 11, and power supply current flowing through the BGA 2 flows to the semiconductor chip 8 through the vias 6, the through holes 9, the bias 6 and the terminal pattern portions of the power supply pattern 3a-2 and the bump array 7.

Here, when considering a case where the semiconductor chip 8 is a GPU (Graphics Processing Unit) or a CPU (Central Processing Unit) consuming large current and is loaded on the package substrate 5, large current flows from a power supply arranged on the system board toward the semiconductor chip 8 through the wiring patterns of the power supply layers of the package substrate 5. Then, large current from the semiconductor chip 8 flows out to the power supply arranged on the system board through the not-shown ground pattern in the ground layer of the package substrate 5.

In this case, when plural vias/through holes have the equivalent structure without any particular consideration concerning formation of vias/through holes formed so as to pierce through the interlayer insulating layers of the package substrate 5, there is a problem that large current is concentrated in vias/through holes which electrically connect the system board to the semiconductor chip 8 at the shortest distance (corresponding to vias/through holes to be arranged just below the semiconductor chip 8 in many cases in flip-chip mounted products).

For example, when the system board and the semiconductor chip 8 are connected by vias (conductivity (or resistivity) is assumed to be the same in all vias) the electrical shortest path from the system board to the semiconductor chip 8 is the same as the actual geometrical shortest distance, and most current flows in an area corresponding to the area just below the semiconductor chip 8 (current concentration portion) as shown by outline arrows in FIG. 11, as a result, large current is concentrated in the vias 6 corresponding to the area just below the semiconductor chip 8.

Accordingly, local unusual heat generation causes fusion breakdown of conductor patterns by copper foil and the like or fusion breakdown of a via structure, and further, electromigration causes pattern short-circuit after a long period of time passes after the flow of power supply current, which may lead to various failures such as lowering of electric reliability. The problem of current concentration is likely to further reduce the electric reliability caused by the concentration, which may lead to a serious problem when considering the tendency of increase in current density of future semiconductor products.

In a normal build-up substrate having a structure of a build-up layer, a core layer and a build-up layer, there are some effects of slightly diffusing and alleviating the current concentration, for example, in the case where through holes exist in the core layer as shown in FIG. 12. However, it is possible to provide power supply wiring in which power supply current at which the semiconductor chip 8 is driven flows between the semiconductor chip (IC) and the system board with the shortest distance in a case of a coreless substrate and so on having a stacked via structure, as a result, AC power characteristics are improved. Conversely, effects of diffusing and alleviating the current concentration in the substrate are small, which increases the risk of DC current concentration.

In Patent Document 1, there is disclosed a technology in which a plurality of reinforcement vias to be current flow paths are formed around a through hole in which large current flows, and one or plural conductive patterns electrically connecting the through hole to the reinforcement vias are formed at a substrate outer layer and a substrate inner layer to thereby distributing current to surrounding reinforcement vias so that current is not concentrated only in the through hole. In the technology, an electrode terminal of an electronic component to be loaded is inserted to the through hole to be connected to a power supply layer in a multilayer wiring substrate, therefore, electric current is dispersed and allowed to flow into the reinforcement vias only in the through hole to which the electrode terminal is inserted, namely, current can merely be dispersed only in the limited particular through hole.

That is, the dispersion of current in the technology disclosed in Patent Document 1 is not effective for all interlayer connection conductors such as through holes or vias piercing through interlayer insulating layers of the multilayer wiring substrate, which are positioned corresponding to a loading area on which the electronic part is loaded, and current merely flows in the limited particular through hole.

Unless the multilayer wiring substrate is configured so that current is not concentrated concerning all interlayer connection conductors such as through holes and vias connecting between conductive layers (power supply layers) in which power supply current at which the semiconductor chip is driven flows, which are positioned corresponding to a loading area where the semiconductor chip is loaded, current concentration occurs in the interlayer connection conductors in the loading area, which causes occurrence of local unusual heat generation as well as causes generation of electromigration, as a result, it is difficult to maintain good electric reliability. Furthermore, as occurrence of unusual heat generation has adverse effects on operation of the semiconductor chip, it becomes difficult to maintain good operation.

In view of the above, it is desirable to provide a package substrate capable of alleviating large current concentration, a module and an electric/electronic device using the same.

An embodiment of the present disclosure relates to a package substrate including a first conductive layer (for example, a wring layer 3a in a later-described embodiment) having plural first terminal pattern portions (for example, a ground pattern 3a-1, power supply patterns 3a-2, 3a-3 in the later-described embodiment) connected to a semiconductor part (for example, a semiconductor chip 8 in the later-described embodiment) loaded on a first principal surface through plural first external connection conductors (for example, a bump array 7 in the later-described embodiment), which is formed on the first principal surface, a second conductive layer (for example, a wiring layer 3f in the later-described embodiment) having plural second terminal patterns connected to a system substrate mounted on a second principal surface opposite to the first principal surface through a second external connection conductor (for example, a BGA 2 in the later-described embodiment), which is formed on the second principal surface, an intermediate conductive layer (for example, wiring layers 3b to 3e) formed between the first conductive layer and the second conductive layer, interlayer insulating layers formed between the first conductive layer and the intermediate conductive layer as well as between the second conductive layer and the intermediate conductive layer and plural interlayer connection conductors (for example, high-resistance vias 6a, low-resistance vias 6b in the later-described embodiment) stacked for connecting between the first conductive layer and the second conductive layer so as to pierce through the interlayer insulating layers, in which the first terminal pattern portions, the first external connection conductors, the interlayer connection conductors, the second terminal pattern portions and the second external connection conductor are connected, current paths connecting the semiconductor part and the system substrate are formed, and the current paths positioned corresponding to a central portion area including a central portion of a loading area on which the semiconductor part is loaded have high resistance and the current paths positioned corresponding to a peripheral area outside the central portion area have low resistance.

Another embodiment of the present disclosure relates to a module having the above package substrate.

Still another embodiment of the present disclosure relates to an electric/electronic device having the above package substrate.

According to the embodiments of the present disclosure, the package substrate includes the first conductive layer having plural first terminal pattern portions connected to a semiconductor part loaded on the first principal surface through plural first external connection conductors, which is formed on the first principal surface, the second conductive layer having plural second terminal patterns connected to the system substrate mounted on the second principal surface opposite to the first principal surface through the second external connection conductor, which is formed on the second principal surface, the intermediate conductive layer formed between the first conductive layer and the second conductive layer, interlayer insulating layers formed between the first conductive layer and the intermediate conductive layer as well as between the second conductive layer and the intermediate conductive layer and plural interlayer connection conductors stacked for connecting between the first conductive layer and the second conductive layer so as to pierce through the interlayer insulating layers, in which the first terminal pattern portions, the first external connection conductors, the interlayer connection conductors, the second terminal pattern portions and the second external connection conductor are connected, current paths connecting the semiconductor part and the system substrate are formed, and the current paths positioned corresponding to a central portion area including a central portion of a loading area on which the semiconductor part is loaded have high resistance and the current paths positioned corresponding to a peripheral area outside the central portion area have low resistance. According to the above structure, current distribution is inclined to the low-resistance side, that is, the current flow can be controlled as a whole and large current concentration can be alleviated. The current concentration does not occur when the semiconductor part consuming large current is loaded, therefore, the package substrate capable of suppressing occurrence of local unusual heat generation as well as suppressing lowering of electric reliability can be provided.

Also according to the embodiments of the present disclosure, the module capable of lowering of electric reliability because of having the above package substrate can be provided.

Also according to the embodiments of the present disclosure, the electric/electronic device capable of lowering of electric reliability because of having the above package substrate can be provided.

DETAILED DESCRIPTION

Figure 1:
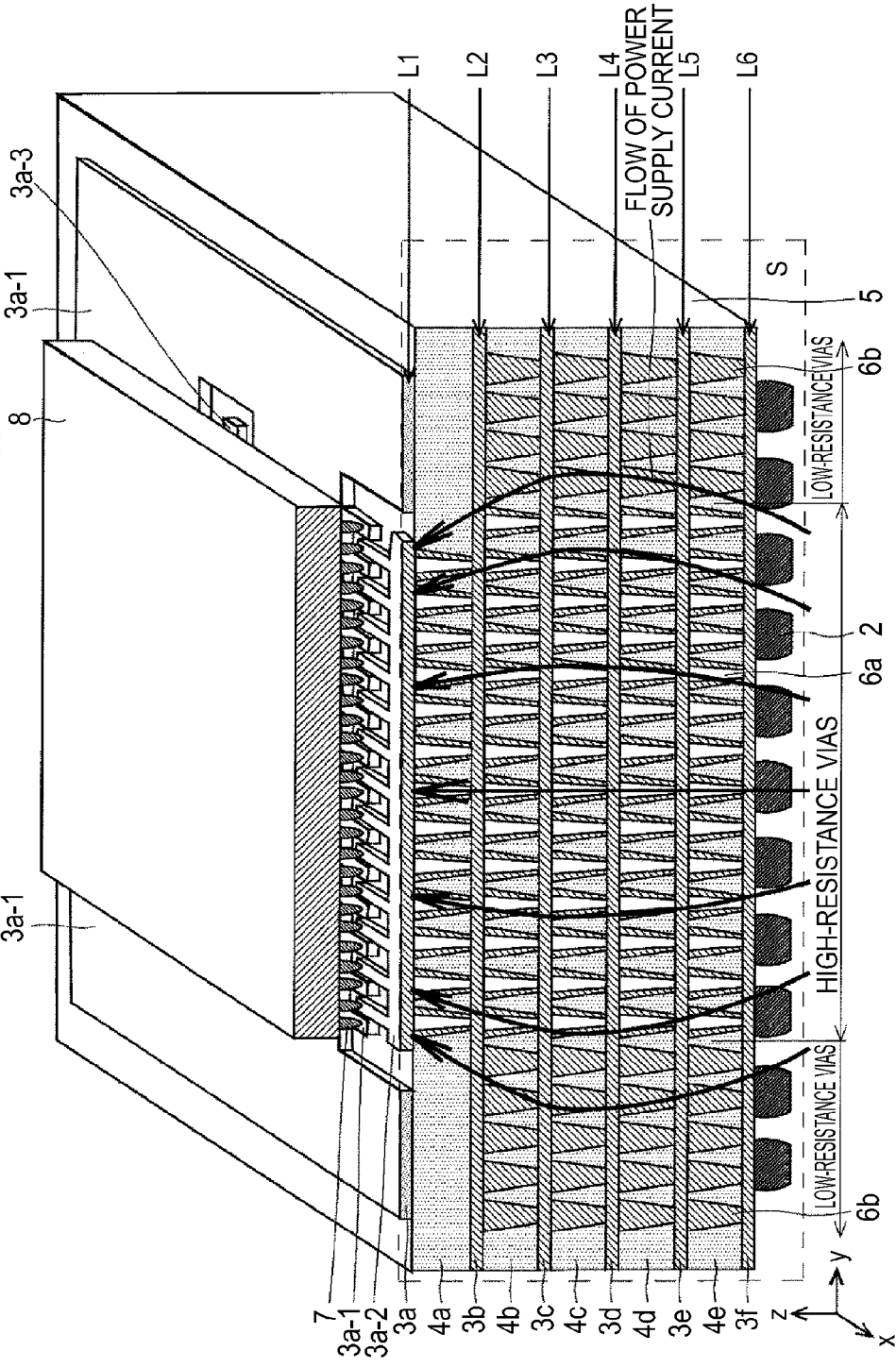
FIG. 1 is a view for explaining a structure of a package substrate (1) according to an embodiment of the present disclosure.

A package substrate of an embodiment of the present disclosure is preferably configured so that power supply current at which a semiconductor component is driven flows in current paths.

It is also preferable that a ground current at which the semiconductor component is driven flows in the current paths.

It is also preferable that interlayer connection conductors having high resistance positioned corresponding to a loading area are included, interlayer connection conductors having low resistance positioned corresponding to a peripheral area outside the loading area are included, a central portion area corresponds to the loading area, and the current paths positioned corresponding to the loading area have high-resistance and the current paths positioned corresponding to the peripheral area outside the loading area have low resistance.

It is also preferable that plural intermediate conductive layers are included, and interlayer insulating layers are formed between adjacent intermediate conductive layers.

It is also preferable that the interlayer connection conductors positioned corresponding to the loading area have high resistance, and the interlayer connection conductors positioned corresponding to the outside area have low resistance in the same interlayer insulating layer.

It is also preferable that the same interlayer insulating layer is the interlayer insulating layer in the second layer counted from the side of a first conductive layer.

It is also preferable that the interlayer connection conductors positioned corresponding to the loading area have high resistance and interlayer connection conductors positioned corresponding to the outside area have low resistance in part or all of the interlayer insulating layers.

It is also preferable that the interlayer connection conductors positioned corresponding to the loading area have high resistance and interlayer connection conductors positioned corresponding to the outside area have low resistance in at least one interlayer insulating layer counted from the side of the first conductive layer.

It is also preferable that the interlayer connection conductors close to the loading area and positioned corresponding to the outside area have high resistance, and the number of the connection conductors having high resistance is increased as the layer number of interlayer insulating layers is increased when counting the layer number of the interlayer insulating layers is counted from the side of the first conductive layer.

It is also preferable that the interlayer connection conductors positioned corresponding to the loading area and the interlayer connection conductors positioned corresponding to the outside area are made of conductive materials having different resistances.

It is also preferable that the plural interlayer connection conductors stacked for connecting between the first conductive layer and a second conductive layer are formed to have a stacked via structure.

It is also preferable that the interlayer connection conductors are any of filled vias, hollow vias or through holes in the same interlayer insulating layer.

It is also preferable that the interlayer connection conductors positioned corresponding to the loading area and the interlayer connection conductors positioned corresponding to the outside area have different diameters.

It is also preferable that the interlayer connection conductors are the hollow vias or the through holes, and the interlayer connection conductors positioned corresponding to the loading area and the interlayer connection conductors positioned corresponding to the outside area have walls having different plating thicknesses.

It is also preferable that the central portion area is the loading area, a second external connection conductor positioned corresponding to the loading area has high resistance and the second external connection conductor positioned corresponding to the peripheral area outside the loading area has low resistance, and the current paths positioned corresponding to the loading area have high resistance and the current paths positioned corresponding to the peripheral area outside the loading area have low resistance.

It is also preferable that first external connection conductors positioned corresponding to the central portion area have high resistance and the first external connection conductors positioned corresponding to the peripheral area outside the central portion area have low resistance, and the current paths positioned corresponding to the central portion area have high resistance and the current paths positioned corresponding to the peripheral area outside the central portion area have low resistance.

In a structure of the package substrate including the first conductive layer having plural first terminal pattern portions connected to a semiconductor part loaded on a first principal surface through plural first external connection conductors, which is formed on the first principal surface, the second conductive layer having plural second terminal patterns connected to a system substrate mounted on a second principal surface opposite to the first principal surface through a second external connection conductor, which is formed on the second principal surface, the intermediate conductive layer formed between the first conductive layer and the second conductive layer, the interlayer insulating layers formed between the first conductive layer and the intermediate conductive layer as well as between the second conductive layer and the intermediate conductive layer and the plural interlayer connection conductors stacked for connecting between the first conductive layer and the second conductive layer so as to pierce through the interlayer insulating layers, in which the first terminal pattern portions, the first external connection conductors, the interlayer connection conductors, the second terminal pattern portions and the second external connection conductor are connected, current paths connecting the semiconductor part and the system substrate are formed, and the interlayer connection conductors having high resistance positioned corresponding to the loading area on which the semiconductor part is loaded are included, the interlayer connection conductors having low resistance positioned corresponding to the peripheral area outside the loading area are included, it is preferable that the second external connection conductor positioned corresponding to the loading area has high resistance and the second external connection conductor positioned corresponding to the peripheral area outside the loading area has low resistance, and the current paths positioned corresponding to the loading area have high resistance and the current paths positioned corresponding to the peripheral area outside the loading area have low resistance, or it is preferable that the first external connection conductors positioned corresponding to the central portion area including the central portion of the loading area have high resistance and the first external connection conductors positioned corresponding to the peripheral area outside the central portion area have low resistance, and the current paths positioned corresponding to the central portion area have high resistance and the current paths positioned corresponding to the peripheral area outside the central portion area have low resistance, it is further preferable that the power supply current at which the semiconductor part is driven flows in the current paths, or that the ground current at which the semiconductor part is driven flows in the current paths.

Any of the above structures has a function of processing complicated processing in a short time, therefore, when the semiconductor parts consuming large current, for example, a GPU, a CPU and so on are loaded, the current flow can be controlled and large current concentration can be alleviated, therefore, current concentration does not occur. As a result, occurrence of local unusual heat generation can be suppressed and fusion breakdown of the conductor patterns or fusion breakdown of the interlayer connection conductors, and further, occurrence of electromigration can be capable of suppressing the lowering of electric reliability can be provided. It goes without saying that the package substrate according to the embodiments of the present disclosure has a structures obtained by combining with some of the above structures.

Hereinafter, embodiments of the present disclosure will be explained with reference to the drawings. The present disclosure includes structures satisfying the above operation and effect and is not limited to the embodiments. As the drawings shown below are simplified for making the structure clearly understandable, scales are not strictly accurate.

Embodiment

Embodiments of the present disclosure relate to a package substrate on which a semiconductor chip (IC) consuming large current such as a CPU or a GPU is mounted. Conductive layers such as a signal wiring pattern layer (signal layer), a power supply layer and a ground layer in which signal current, power supply current and ground current at which the semiconductor chip is driven flow respectively are stacked as wiring layers to be formed in the package substrate through interlayer insulating layers.

As structures concerning the package substrate for suppressing concentration of power supply current and for suppressing concentration of ground current at which the semiconductor chip is driven are the same except that directions of flowing current are opposite, therefore, the structure concerning the package substrate for suppressing concentration of power supply current at which the semiconductor chip is driven will be explained below. In the drawings shown below, the signal layer and the ground layer excluding part thereof are omitted for simplification.

Interlayer connection conductors are conductors formed so as to pierce through the interlayer insulating layers of a multilayer wiring substrate to electrically connect between conductive layers of the multilayer wiring substrate such as vias and through holes. Note that vias and through holes having high resistance are simply referred to as high-resistance vias and high-resistance through holes, and that vias and through holes having low resistance are simply referred to as low-resistance vias and low-resistance through holes.

<Package Substrate (1)>

In a package substrate (1), high-resistance vias having high resistance are arranged in a loading area of the semiconductor chip which consumes large current and low-resistance vias having low resistance are arranged in a peripheral area outside the loading area, namely, the high-resistance vias and the low-resistance vias having different via structures are formed in a mixed state in the same interlayer insulating layer of the package substrate. The loading area of the semiconductor chip is an area corresponding to a projection surface of the semiconductor chip in the package substrate when the semiconductor chip is projected on the package substrate.

As the current flow avoids the high-resistance vias and is distributed in directions of low-resistance vias, the current flow can be controlled by suitably arranging the high-resistance vias and the low-resistance vias, thereby alleviating the large current concentration.

FIG. 1 is a view for explaining a structure of the package substrate (1) according to the embodiment of the present disclosure.

FIG. 1 is a view for explaining the package substrate (1) on which a semiconductor chip 8 is loaded according to the embodiment of the present disclosure, which is the view showing a cross-sectional structure of a package substrate 5.

Figure 2:
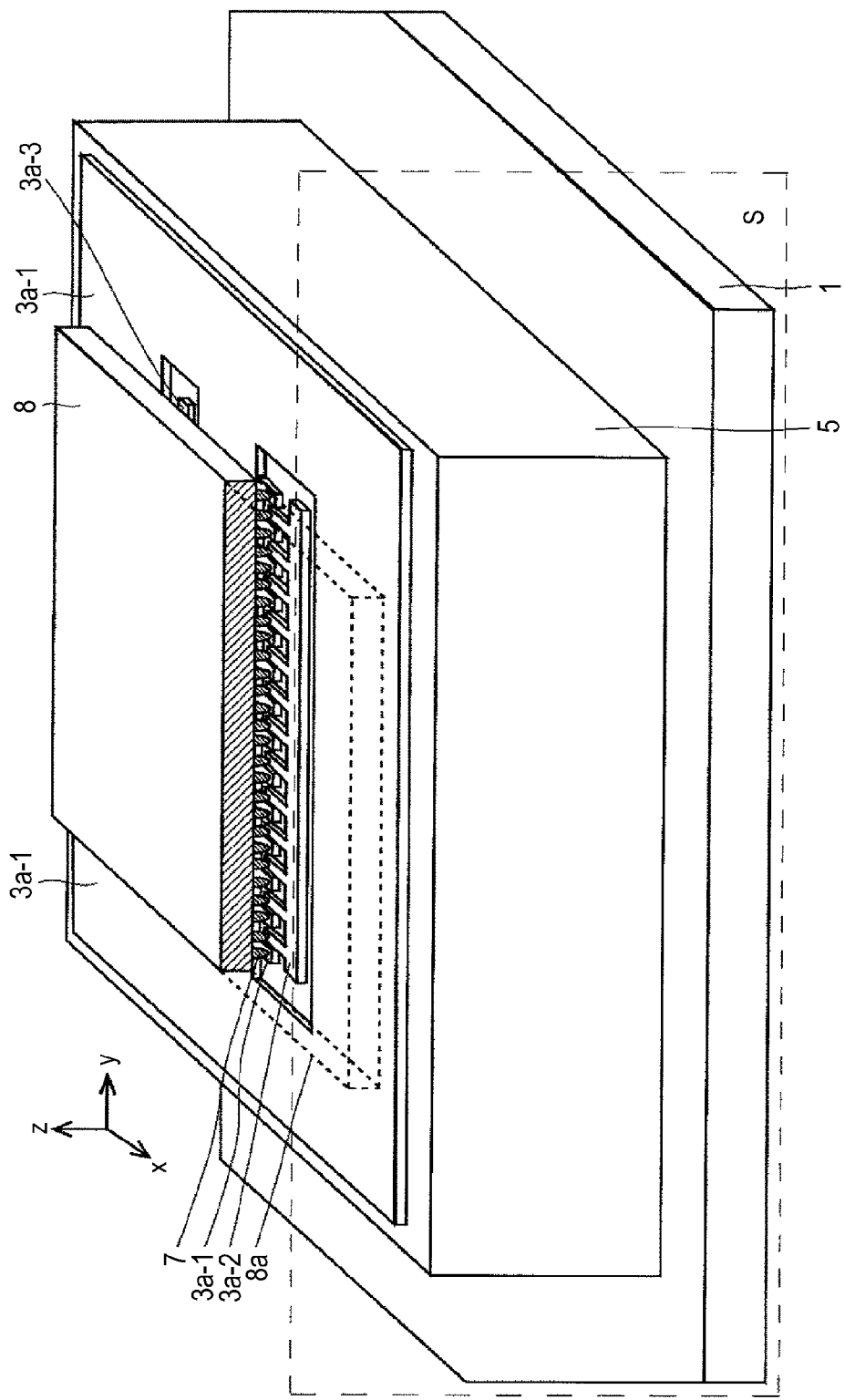
FIG. 2 is a view for explaining the package substrate (1) on which a semiconductor chip is loaded according to the embodiment of the present disclosure.

FIG. 2 is a perspective view including a cross section of the semiconductor chip 8, showing a cut-out portion 8a of the semiconductor chip 8 indicated by dotted lines which is cut out from the semiconductor chip 8 and showing a state where the semiconductor chip 8 is loaded on the package substrate 5 as well as the package substrate 5 is loaded on a system board (system substrate) 1.

FIG. 1 is a perspective view including the cross-section formed by cutting out part of the semiconductor chip 8, which includes the cross-section of the semiconductor chip 8 shown by cutting the cut-out portion 8a from the semiconductor chip 8 indicated by dotted line in FIG. 2 and a cross-section of the package substrate 5 in a cross-sectional position shown by a surface S parallel to a ZY surface in FIG. 2. The surface S is a surface passing through a power supply pattern 3a-2.

As shown in FIG. 1 and FIG. 2, the semiconductor chip 8 is loaded on one principal surface of the package substrate 5 through a bump array 7 arranged two-dimensionally on a surface parallel to an xy surface. Additionally, the other principal surface opposite to one principal surface of the package substrate 5 is loaded on and connected to a system board 1 through a BGA (ball grid array) 2 in which balls made of solder and the like are arranged two-dimensionally on the surface parallel to the xy surface as shown in FIG. 1.

In FIG. 1, power supply patterns 3a-2, 3a-3 and a ground pattern 3a-1 forming part of a wiring layer 3a formed on a surface layer (these patterns form part of a first power supply layer), internal wiring layers 3b to 3e (forming an intermediate power supply layer) and a wiring layer 3f in which a not-shown power supply pattern and a ground pattern are formed (forming a second power supply layer) are shown. Power supply current at which the semiconductor chip 8 is driven flows in the power supply patterns 3a-2, 3a-3, and ground current at which the semiconductor chip 8 is driven flows in the ground pattern 3a-1.

There is shown a state in which terminal pattern portions of the ground pattern 3a-1 and terminal pattern portions of the power supply pattern 3a-2 are respectively connected to the semiconductor chip 8 through the bump array 7.

The terminal pattern portions of the ground pattern 3a-1 and the terminal pattern portions of the power supply pattern 3a-2 are alternately formed like comb teeth in mesh. The terminal pattern portions of the power supply pattern 3a-2 are connected to vias 6a, 6b through the bump array 7. The terminal pattern portions of the power supply pattern 3a-3 are also connected to the vias 6a, 6b through a not-shown bump array 7.

As shown in FIG. 1, an L1 layer (first power supply layer) and an L6 layer (second power supply layer) of the package substrate 5 are the outermost conductive layers in the multilayer substrate. The conductive layer of the L1 layer includes the power supply patterns 3a-2, 3a-3 in which power supply current at which the semiconductor chip 8 is driven flows and the ground pattern 3a-1 of the ground layer in which ground current at which the semiconductor chip 8 is driven flows. The conductive layer of the L6 layer shows a wiring layer 3f in which the power supply pattern (not shown) in which power supply current at which the semiconductor chip 8 is driven flows and the ground pattern (not shown) in which ground current at which the semiconductor chip 8 is driven flows.

The conductive layers of the L2 layer to the L5 layers are internal power supply layers (intermediate power supply layers) in a multilayer substrate, which are wiring layers in which power supply current at which the semiconductor chip 8 is driven flows. The conductive layers of the L1 layer to the L6 layer are stacked through interlayer insulating layers 4a to 4e.

As shown in FIG. 1, vias 6a, 6b piercing through each of the interlayer insulating layers 4a to 4e are formed as interlayer connection conductors, and power supply current flowing in the power supply pattern of the L6 layer through the BGA 2 flows to the semiconductor chip 8 through the vias 6a, 6b, the terminal pattern portions of the power supply pattern 3a-2 and the power supply pattern 3a-3 and the bump array 7. Then, the current from the semiconductor chip 8 flows out to the ground pattern 3a-1, the ground layer (not shown) of the package substrate 5 and the system board.

Concerning vias connecting between conductive patterns in which power supply current (the same applies to ground current) at which the semiconductor chip 8 is driven flows, it is common to arrange a large number of vias in parallel for reducing parasitic inductance/parasitic resistance components existing in one via. When the semiconductor chip 8 consuming large current is flip-chip mounted, the vias are usually arranged closely so that spaces between vias are narrow to the limit allowable in manufacturing rules in the loading area of the semiconductor chip 8 for obtaining the effect of radiating heat in addition to the reduction of inductance.

In the package substrate (1), the high-resistance vias 6a are used only inside the loading area where the semiconductor chip 8 is loaded and current is liable to be concentrated and low-resistance vias 6b are used in the peripheral area outside the loading area in the package substrate 5 on which the semiconductor chip 8 consuming large current is loaded, namely, vias having different resistances are used properly at areas inside and outside the loading area.

The high-resistance vias 6a are, for example, hollow vias, insulating or dielectric resin-filled vias (filled vias) and so on, and the low-resistance vias 6b are, for example, filled vias filled by metal or conductive paste and so on. The high-resistance vias 6a are preferably formed by using conductive materials having high resistance and the low-resistance vias are preferably formed by using conductive materials having low resistance. In the example shown in FIG. 1, the high-resistance vias 6a are hollow vias and the low-resistance vias are metal-filled vias.

As shown in FIG. 1, current flowing in the package substrate 5 in the loading area of the semiconductor chip 8 does not flow smoothly through paths in which current is directed upward to the semiconductor chip 8 (paths parallel to the z-direction) due to existence of the high-resistance vias 6a. As the low-resistance vias 6b are arranged outside the loading area of the semiconductor chip 8, the resistance is suppressed to be lower as compared with the inside of the loading area, therefore, part of current flows in directions outside the loading area as indicated by arrows. As described above, the current flow can be controlled in a broad point of view, which can alleviate the current concentration.

Owing to the effect of alleviating the current concentration as described above, the current concentration to vias in the area just below the semiconductor chip 8 and occurrence of local unusual heat generation are suppressed as compared with the case of using vias having the same resistance in the inside and the outside of the loading area, therefore, normal operation (reliability) of the semiconductor chip 8 can be maintained.

According to the structure of the package substrate (1) explained above, when the semiconductor chip 8 such as the GPU/CPU consuming large current is loaded on the package substrate 5, the current concentration does not occur in the interlayer connection conductors in the loading area of the semiconductor chip 8, therefore, occurrence of local unusual heat generation can be suppressed.

As occurrence of local unusual heat generation can be suppressed, fusion breakdown of the conductor patterns or fusion breakdown of a via structure, and further, occurrence of electromigration can be suppressed, which can suppress the lowering of electric reliability.

As occurrence of local unusual heat generation at the loading area of the semiconductor chip can be suppressed, unusual heat generation has little effect on the semiconductor chip, thereby maintaining good operation (reliability).

Interlayer connection conductors in the interlayer insulating layer between ground layers in the package substrate 5 can be the same structure as interlayer connection conductors in the interlayer insulating layer between power supply layers.

In this case, the high-resistance vias are arranged in the loading area of the semiconductor chip and the low-resistance vias are arranged in the peripheral area outside the loading area, namely, the high-resistance vias and the low-resistance vias having different via structures are formed in a mixed state in the same interlayer insulating layer of the package substrate 5 when the package substrate 5 is fabricated.

Though the current direction is opposite to the direction shown in FIG. 1, the current flow avoids the high-resistance vias and is distributed to the direction of the low-resistance vias, therefore, the current flow can be controlled by properly arranging the high-resistance vias and the low-resistance vias, thereby alleviating the large current concentration. Accordingly, the same effects as the case of the interlayer connection conductors in the interlayer insulating layer between power supply layers.

<Package Substrate (2)>

Figure 3:
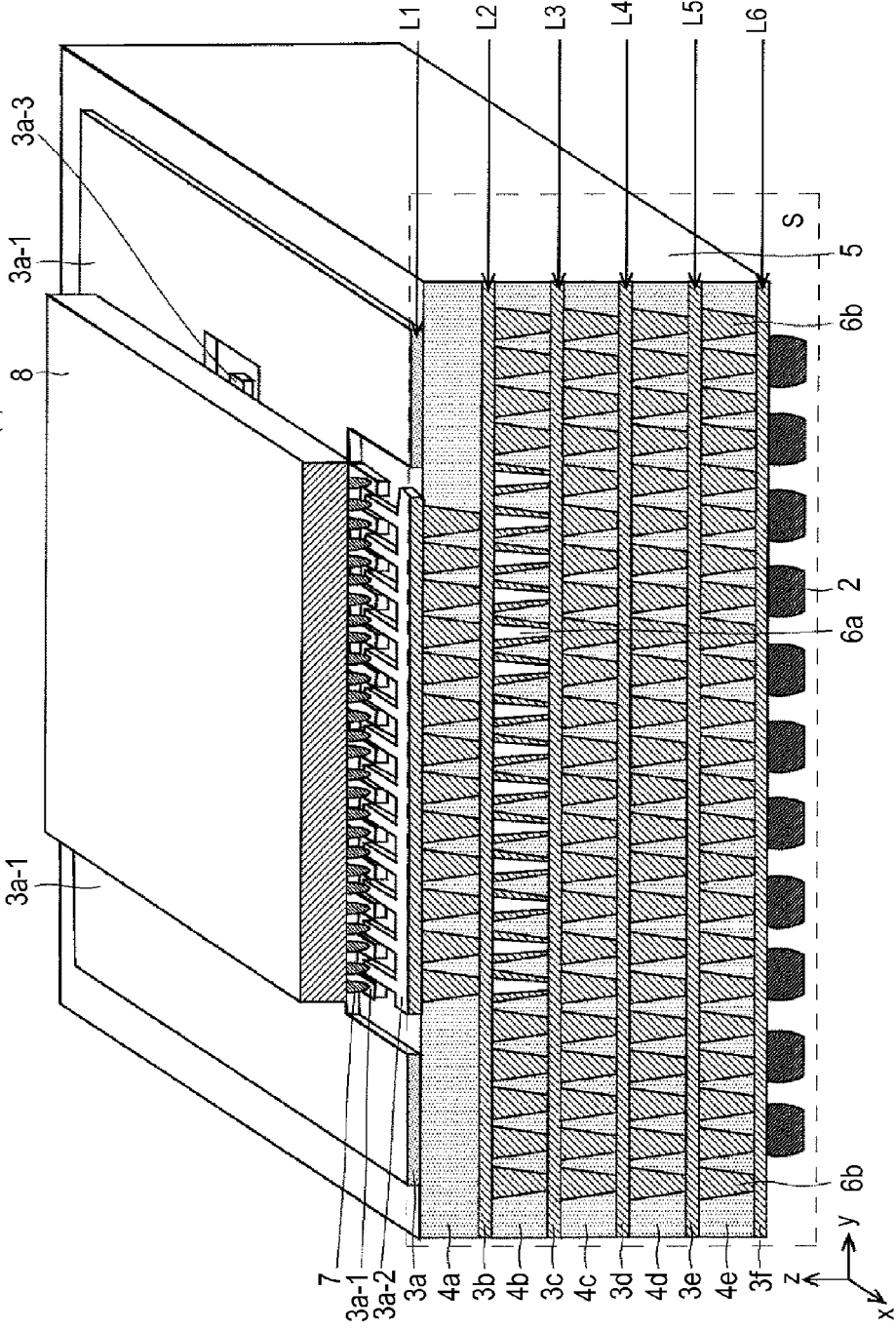
FIG. 3 is a view for explaining a structure of a package substrate (2) according to an embodiment of the present disclosure.

FIG. 3 is a view for explaining a structure of a package substrate (2) according to an embodiment of the present disclosure, which is a perspective view including a cross-section formed by cutting out part of the semiconductor chip 8 and a view showing a cross-sectional structure of the package substrate 5 shown in the same manner as FIG. 1.

Though all interlayer connection conductors in the loading area of the semiconductor chip 8 are high-resistance vias 6a in the package substrate (1), there is a case where it is difficult to form the interlayer connection conductors in all layers of the interlayer insulating layers 4a to 4e to be the high-resistance vias 6a in the light of the structure of the package substrate 5 and the cost increase.

In such case, in the package substrate (1) shown in FIG. 1, the low-resistance vias 6b are arranged in the loading area of the semiconductor chip 8 in the interlayer insulating layers 4a, 4c to 4e, and the high-resistance vias 6a are arranged in the loading area of the semiconductor chip 8 and the low-resistance vias 6b are arranged in a peripheral area outside the loading area only in the interlayer insulating layer 4b which is the vicinity of the semiconductor chip 8 as shown by the package substrate (2) shown in FIG. 3. In the example shown in FIG. 3, the high-resistance vias 6a are hollow vias and the low-resistance vias 6b are metal-filled vias.

According to the structure of the package substrate (2), the effect of alleviating the current concentration can be obtained though the effect is limited.

<Package Substrate 3>

Figure 4:
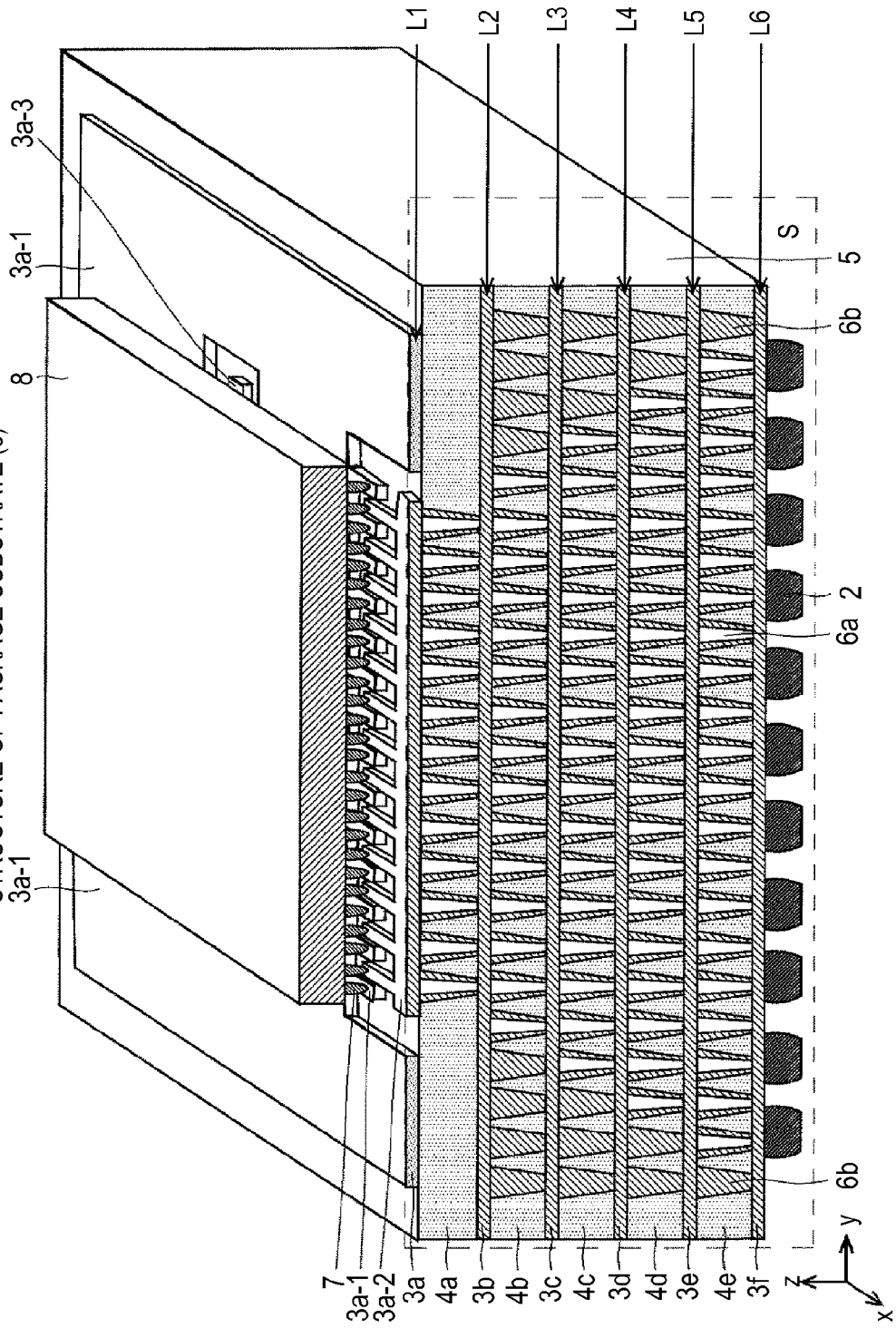
FIG. 4 is a view for explaining a structure of a package substrate (3) according to an embodiment of the present disclosure.

FIG. 4 is a view for explaining a structure of a package substrate (3) according to an embodiment of the present disclosure, which is a perspective view including a cross-section formed by cutting out part of the semiconductor chip 8 and a view showing a cross-sectional structure of the package substrate 5 shown in the same manner as FIG. 1.

In the package substrate (1) shown in FIG. 1, it is also preferable that the area in which the high-resistance vias 6a are formed is expanded as coming close to the principal surface of the package substrate 5 on the side near the system board, namely, near the BGA 2, when capable of being fabricated on processes. That is, a larger number of high-resistance vias 6a are formed in interlayer insulating layers close to the above principal surface side in the package substrate (1) shown in FIG. 1. In the example of FIG. 4, the high-resistance vias 6a are hollow vias and the low-resistance vias 6b are metal-filled vias.

The area in which the high-resistance vias 6a are formed is limited to the loading area of the semiconductor chip 8 in the structure of the package substrate (1), however, the high-resistance vias 6a are formed also in the peripheral areas outside the loading area of the semiconductor chip 8 in the structure of the package substrate (3). In the example shown in FIG. 4, two, four, six and eight high-resistance vias 6a are respectively formed in the interlayer insulating layers 4b, 4c, 4d and 4e in the peripheral area outside the loading area of the semiconductor chip 8.

In the structure of the package substrate (3) shown in FIG. 4, the effect of alleviating the current concentration is enhanced more than in the case of the structure of the package substrate (1) shown in FIG. 1.

<Package Substrate (4)>

Figure 5:
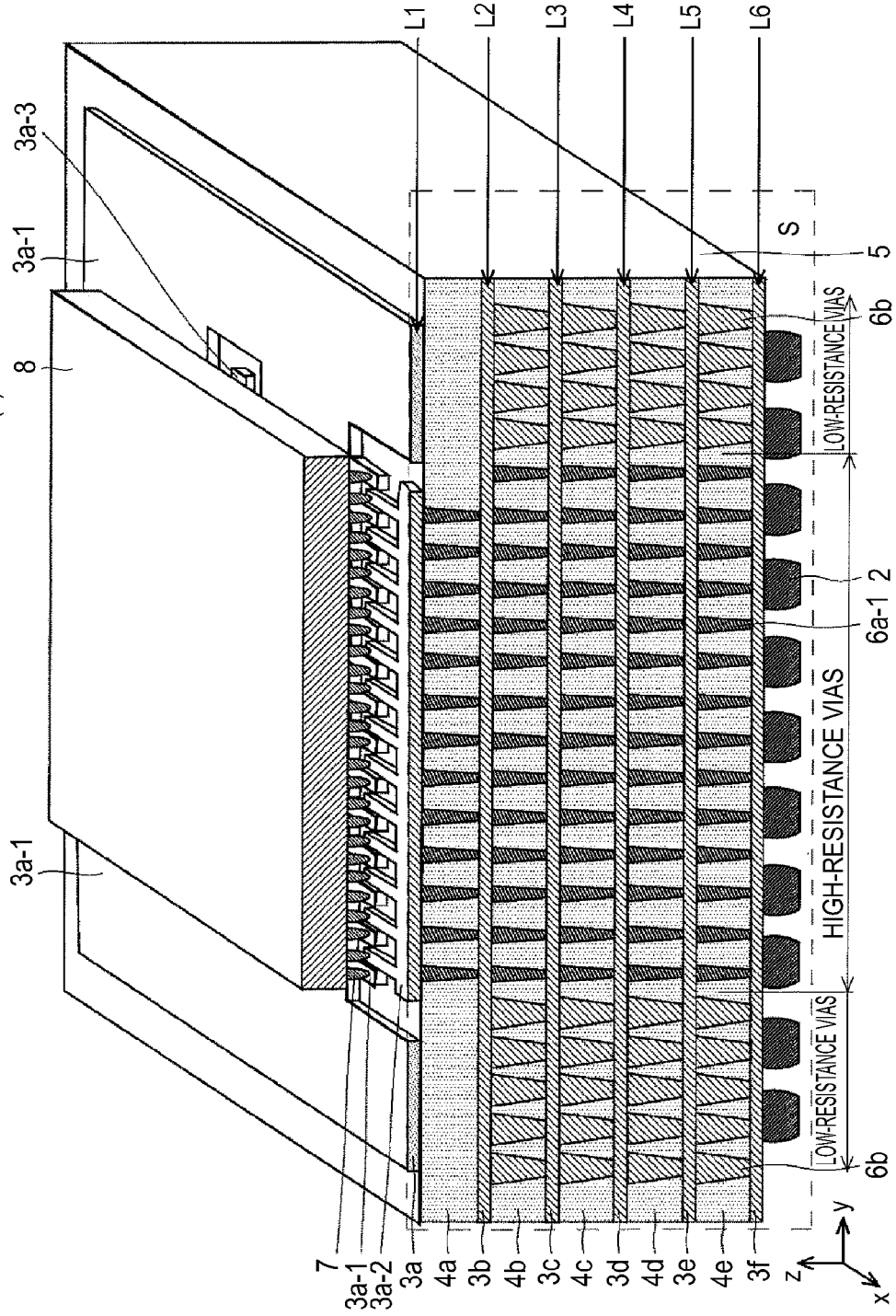
FIG. 5 is a view for explaining a structure of a package substrate (4) according to an embodiment of the present disclosure.

FIG. 5 is a view for explaining a structure of a package substrate (4) according to an embodiment of the present disclosure, which is a perspective view including a cross-section formed by cutting out part of the semiconductor chip 8 and a view showing a cross-sectional structure of the package substrate 5 shown in the same manner as FIG. 1.

As a structure in which a via diameter is changed in the package substrate (1) shown in FIG. 1, the high-resistance vias 6a are changed to high-resistance vias 6a-1 with a small-diameter and the low-resistance vias 6b are formed as large-diameter vias. The small-diameter vias are, for example, hollow vias, insulating or dielectric resin-filled vias (filled vias) and so on, and the large-diameter vias are, for example, filled vias filled by metal or conductive paste and so on. It is desirable to form the high-resistance vias 6a-1 by using conductive materials having high resistance and to form the low-resistance vias 6b by using conductive materials having low resistance. In the example shown in FIG. 5, the high-resistance vias 6a-1 is small-diameter metal-filled vias and the low-resistance vias 6b are large-diameter metal-filled vias.

According to the structure of the package substrate (4) shown in FIG. 5, the effect of alleviating the current concentration can be obtained in the same manner as in the structure of the package substrate (1) shown in FIG. 1.

<Package Substrate (5)>

Figure 6:
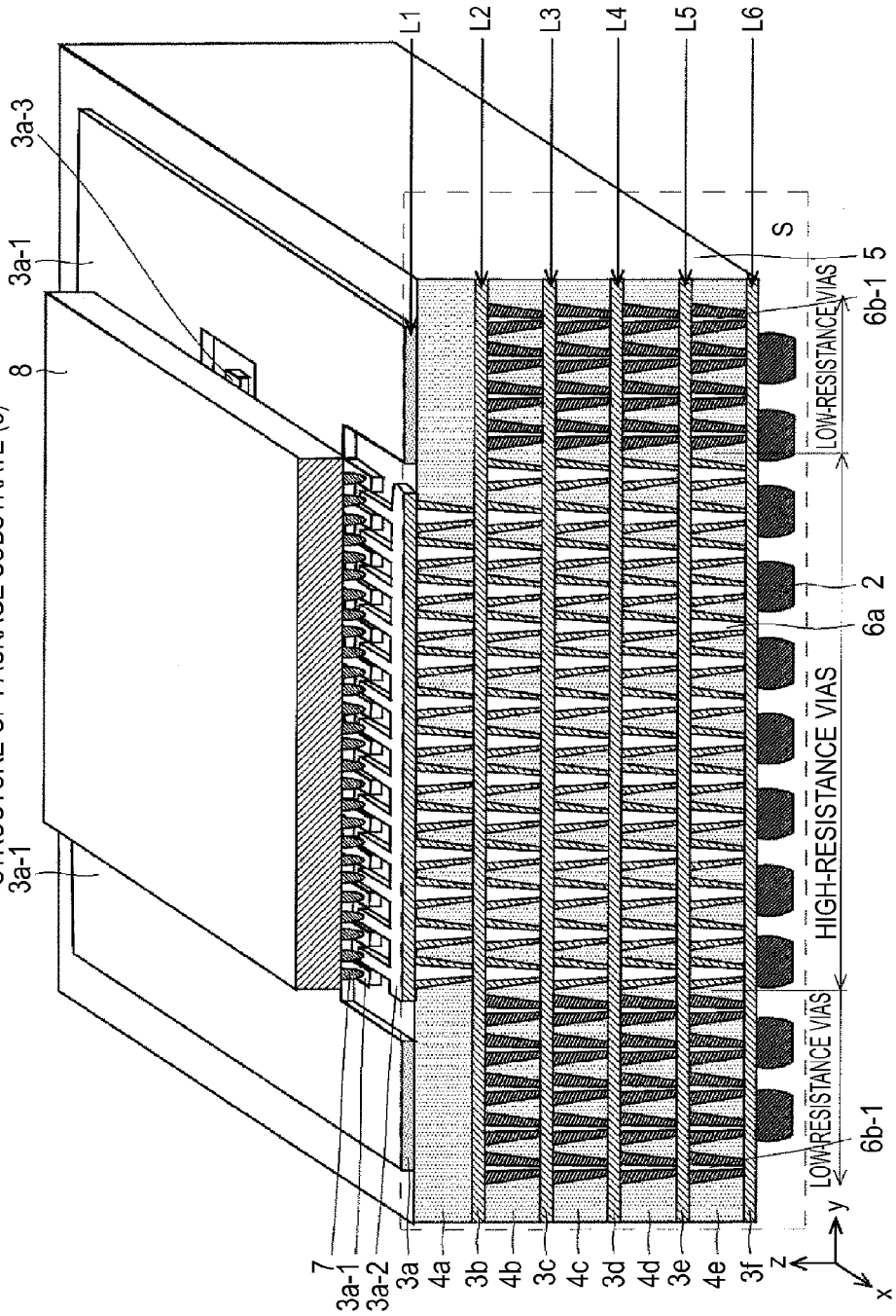
FIG. 6 is a view for explaining a structure of a package substrate (5) according to an embodiment of the present disclosure.

FIG. 6 is a view for explaining a structure of a package substrate (5) according to an embodiment of the present disclosure, which is a perspective view including a cross-section formed by cutting out part of the semiconductor chip 8 and a view showing a cross-sectional structure of the package substrate 5 shown in the same manner as FIG. 1.

Low-resistance vias 6b-1 formed as hollow vias are used as the low-resistance vias 6b in the package substrate (1) shown in FIG. 1. In the example shown in FIG. 6, high-resistance vias 6a are hollow vias having inner walls with thinner plating and the low-resistance vias 6b-1 are hollow vias having inner walls with thicker plating. As shown in FIG. 6, the high-resistance vias and the low-resistance vias can be formed by changing the thickness of inner walls of the vias even when vias having the same diameter are used.

The high-resistance vias 6a and the low-resistance vias 6b-1 can be formed by using a conductive material having the same resistance, however, it is desirable to form the high-resistance vias 6a by using a conductive material having high resistance and to form the low-resistance vias 6b-1 by using a conductive material having low resistance.

According to the structure of the package substrate (5) shown in FIG. 6, the effect of alleviating the current concentration can be obtained in the same manner as in the structure of the package substrate (1) shown in FIG. 1.

<Package Substrate (6)>

Figure 7:
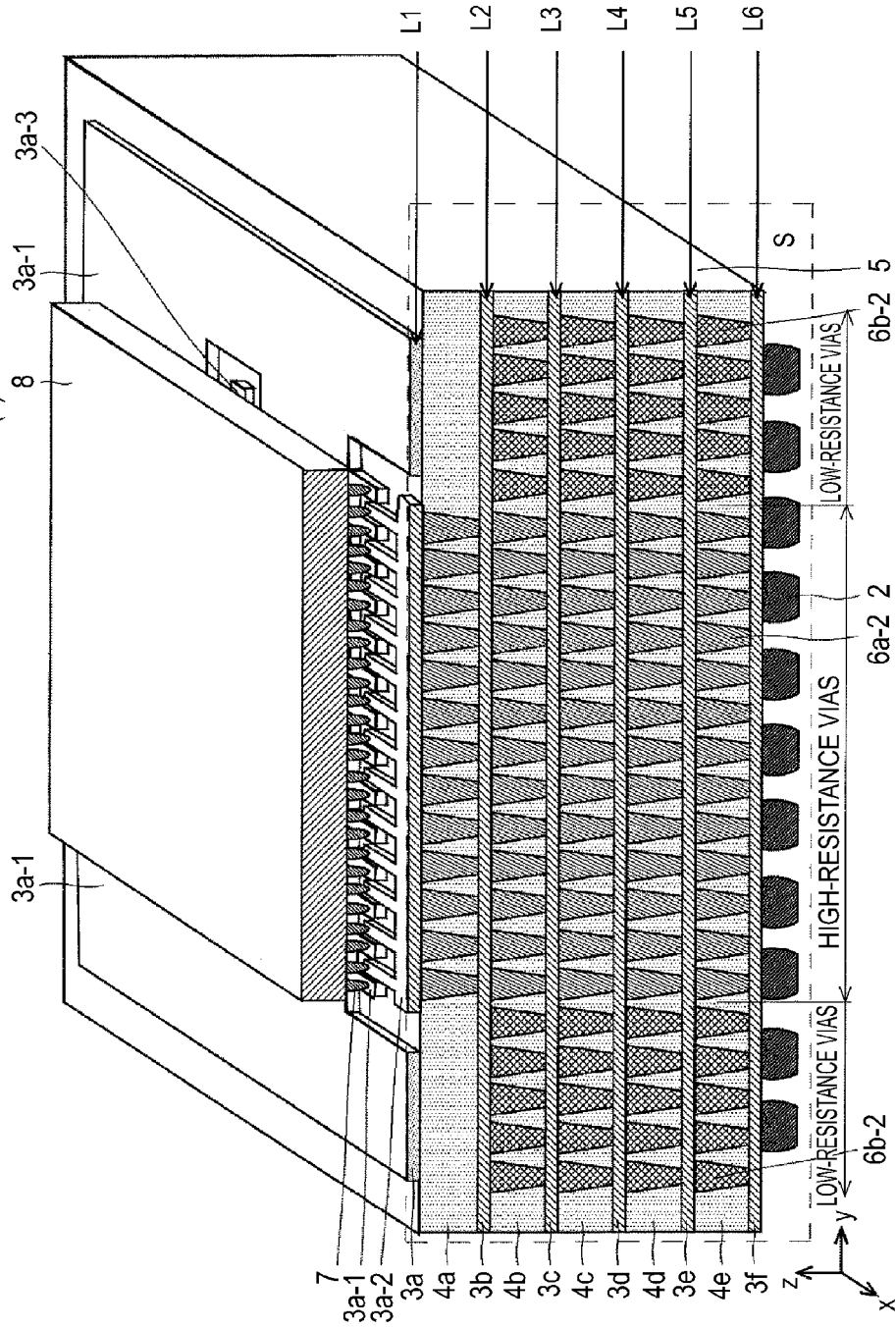
FIG. 7 is a view for explaining a structure of a package substrate (6) according to an embodiment of the present disclosure.

FIG. 7 is a view for explaining a structure of a package substrate (6) according to an embodiment of the present disclosure, which is a perspective view including a cross-section formed by cutting out part of the semiconductor chip 8 and a view showing a cross-sectional structure of the package substrate 5 shown in the same manner as FIG. 1.

In the package substrate (1) shown in FIG. 1, high-resistance vias 6a-2 formed as filled vias in which a conductive material having high conductivity is filled are used as the high-resistance vias 6a and low-resistance vias 6b-2 formed as filled vias in which a conductive material having low conductivity is used as the low-resistance vias 6b.

Materials having high conductivity (or low resistivity) are, for example, copper, silver, gold, chromium and so on, and materials having low conductivity (or high resistivity) are, for example, aluminum, tungsten, molybdenum and so on. As shown in FIG. 7, the high-resistance vias and the low-resistance vias can be formed by changing the conductivity (resistivity) of the conductive material to be filled inside the vias even when the vias having the same diameter are used. The high-resistance vias 6a-2 and the low-resistance vias 6b-2 can have different diameters as long as resistance of the high-resistance vias 6a-2 is formed to be larger than the resistance of the low-resistance vias 6b-2.

According to the structure of the package substrate (6) shown in FIG. 7, the effect of alleviating the current concentration can be obtained in the same manner as in the structure of the package substrate (1) shown in FIG. 1.

<Package Substrate (7)>

Figure 8:
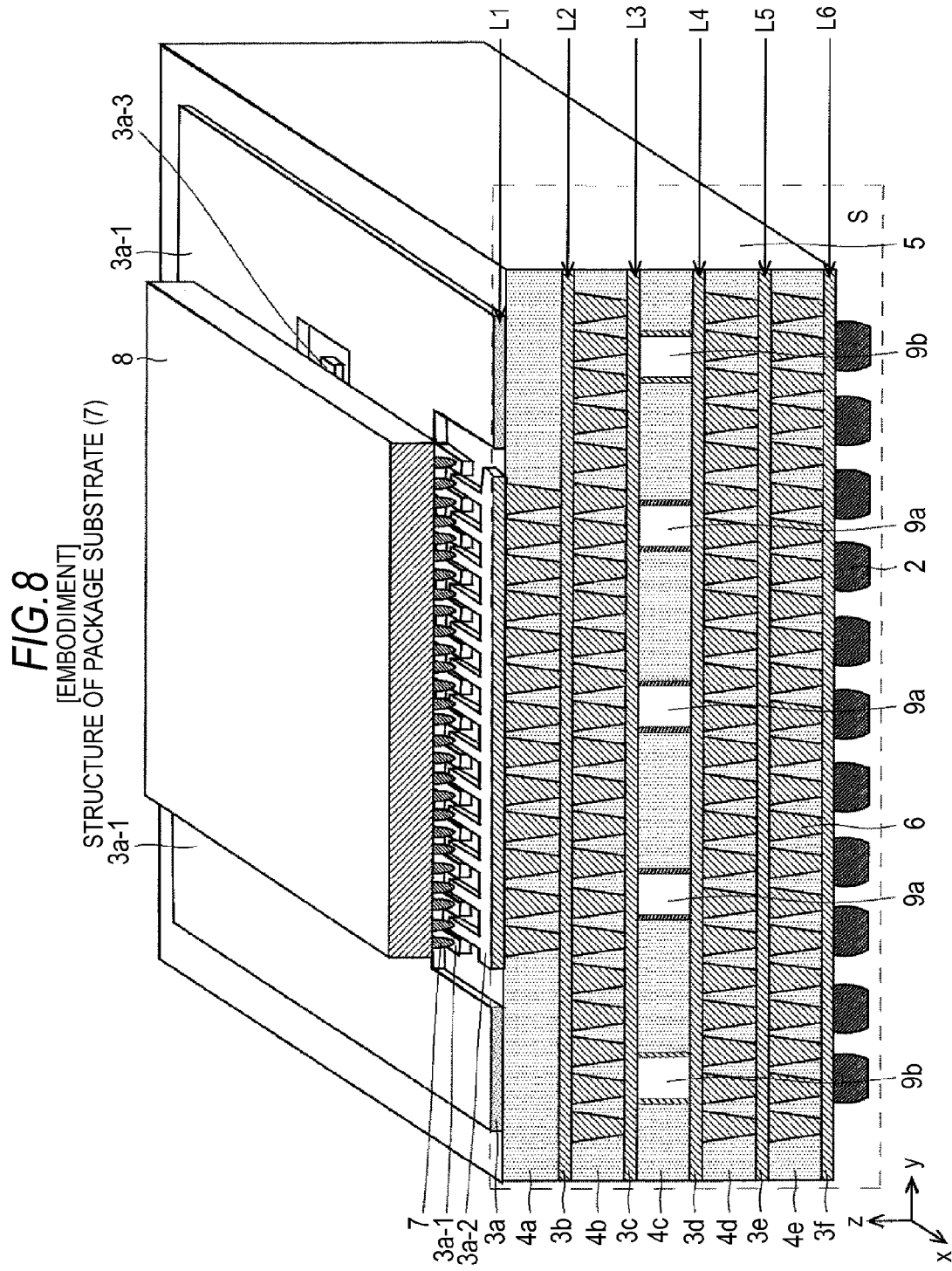
FIG. 8 is a view for explaining a structure of a package substrate (7) according to an embodiment of the present disclosure.

FIG. 8 is a view for explaining a structure of a package substrate (7) according to an embodiment of the present disclosure, which is a perspective view including a cross-section formed by cutting out part of the semiconductor chip 8 and a view showing a cross-sectional structure of the package substrate 5 shown in the same manner as FIG. 1.

Though the high-resistance vias and the low-resistance vias are used as the interlayer connection conductors in the package substrate (1), high-resistance through holes and low-resistance through holes can be used. The high-resistance through holes and the low-resistance through holes can be formed by changing the diameter, plating thickness, materials and so on of through holes.

In the example shown in FIG. 8, vias (filled vias in which a conductive material is filled) 6 are used as interlayer connection conductors in the interlayer insulating layers 4a, 4b, 4c and 4d, and high-resistance through holes 9a are formed in the loading area of the semiconductor chip 8 as the interlayer connection conductors in the interlayer insulating layer 4c, and low-resistance through holes 9b are formed at the peripheral area outside the loading area.

As long as resistance of the high-resistance through holes 9a is formed to be larger than resistance of the low-resistance through holes 9b, the high-resistance through holes 9a and the low-resistance through holes 9b can have the same wall thickness and different diameters as well as the high-resistance through holes 9a and the low-resistance through holes 9b can have different wall thickness and the same diameter. Additionally, the high-resistance through holes 9a and the low-resistance through holes 9b can be formed by using a conductive material having the same resistance. It is desirable to form the high-resistance through holes 9a by using a conductive material having high resistance and the low-resistance through holes 9b are formed by using a conductive material having low resistance.

According to the structure of the package substrate (7) shown in FIG. 8, the effect of alleviating the current concentration can be obtained in the same manner as in the structure of the package substrate (1) shown in FIG. 1.

The effect of alleviating current concentration is obtained by arrangement of the interlayer connection conductors having high resistance and interlayer connection conductors having low resistance which are formed in the interlayer insulating layers of the package substrate 5 as well as structures of the interlayer connection conductors in the structures of the package substrate (1) to the package substrate (7) explained above, however, high-resistance resistive elements and low-resistance resistive elements are used as the bump array 7 connecting between the semiconductor chip 8 and the package substrate 5 or the BGA 2 connecting between the package substrate 5 and the system board 1 respectively to thereby obtain the effect of alleviating the current concentration in the same manner as in the cases of the package substrate (1) to the package substrate (7) as described below.

<Package Substrate (8)>

Figure 9:
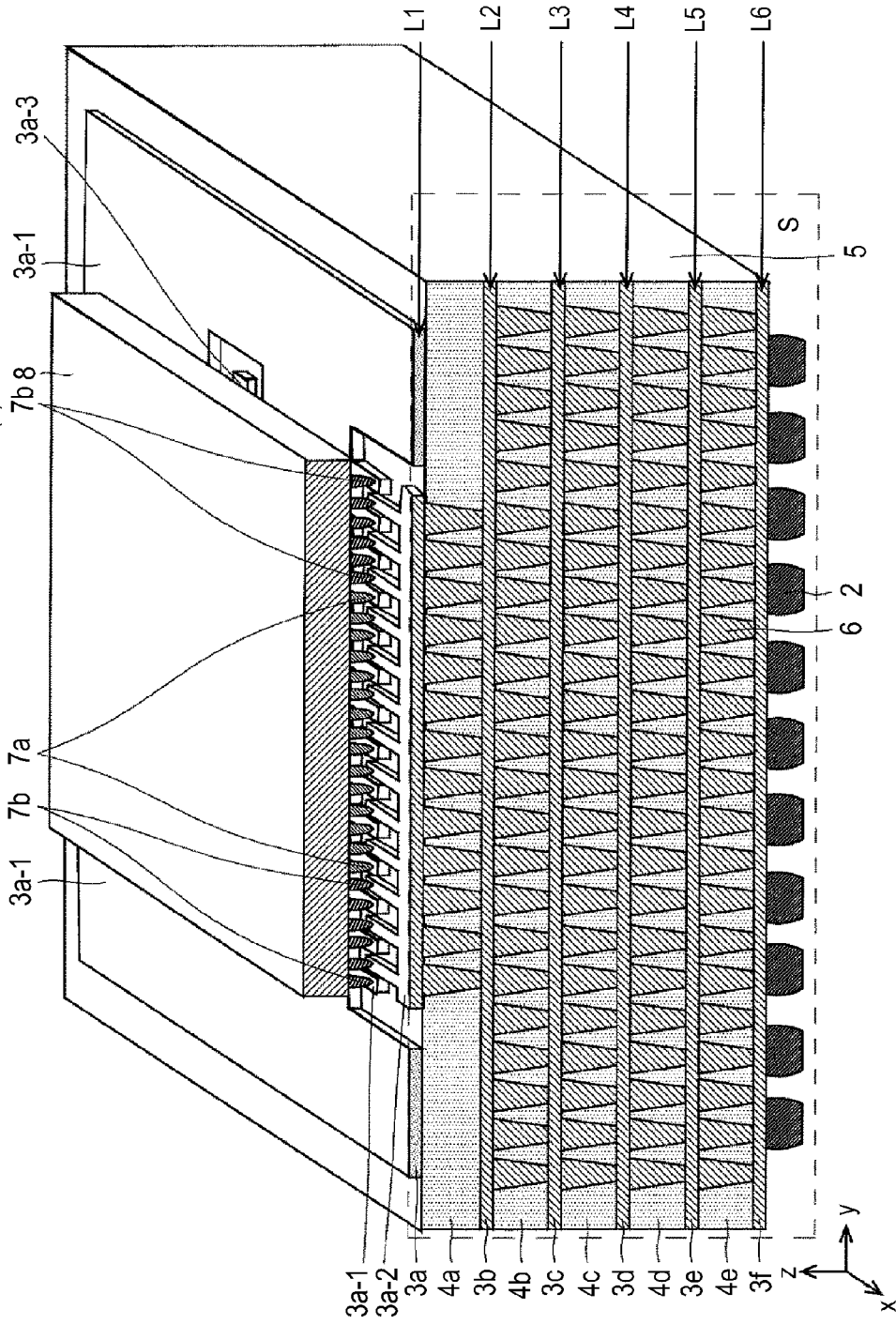
FIG. 9 is a view for explaining a structure of a package substrate (8) according to an embodiment of the present disclosure.

FIG. 9 is a view for explaining a structure of a package substrate (8) according to an embodiment of the present disclosure, which is a perspective view including a cross-section formed by cutting out part of the semiconductor chip 8 and a view showing a cross-sectional structure of the package substrate 5 shown in the same manner as FIG. 1.

In the package substrate (8), a high-resistance bump array 7a is used as a bump array positioned so as to correspond to a central portion area including a central portion of the loading area of the semiconductor chip 8, and a low-resistance bump array 7b is used as a bump array positioned so as to correspond to the peripheral area outside the central portion area including the central portion of the loading area in the package substrate (1) shown in FIG. 1.

In the example shown in FIG. 9, the low-resistance bump array 7b is connected to the terminal pattern portions of the ground pattern 3a-1 and the terminal pattern portions of the power supply pattern 3a-2 formed in the L1 layer in the peripheral area outside the central portion area, and the high-resistance bump array 7a is connected to the terminal pattern portions of the ground pattern 3a-1 and the terminal pattern portions of the power supply pattern 3a-2 formed in the L1 layer in the central portion area.

The high-resistance bump and the low-resistance bump can be formed by changing the level (high/low) in conductivity (or high/low in resistivity) of the conductive material for forming the bump array. Conductive materials having high conductivity (or low resistivity) are, for example, copper, silver, gold, chromium and so on, and materials having low conductivity (or high resistivity) are, for example, aluminum, tungsten, molybdenum and so on.

In the example shown in FIG. 9, vias (filled vias in which a conductive material is filled) 6 are used as interlayer connection conductors in the interlayer insulating layers 4a to 4e, and the high-resistance bump array 7a of central 15-rows is arranged in parallel to the x-direction so as to correspond to the central portion area including the central portion of the loading area of the semiconductor chip 8, and a low-resistance bump array 7b of 6-rows is arranged right and left respectively in parallel to the x-direction so as to correspond to the peripheral area outside the central portion area including the center of the loading area.

In the structure of the package substrate (8) shown in FIG. 9, when the power supply layer (the same applies to the ground layer) is formed in a solid plane state in a re-distribution layer (RDL), the high-resistance bumps are used in the area in which current is liable to be concentrated, namely, in the central portion area including the central portion of the loading area of the semiconductor chip, and the low-resistance bumps are used in the peripheral area outside the central area, thereby obtaining the effect of alleviating the current concentration in the same manner as in the structure of the package substrate (1) shown in FIG. 1.

<Package Substrate (9)>

Figure 10:
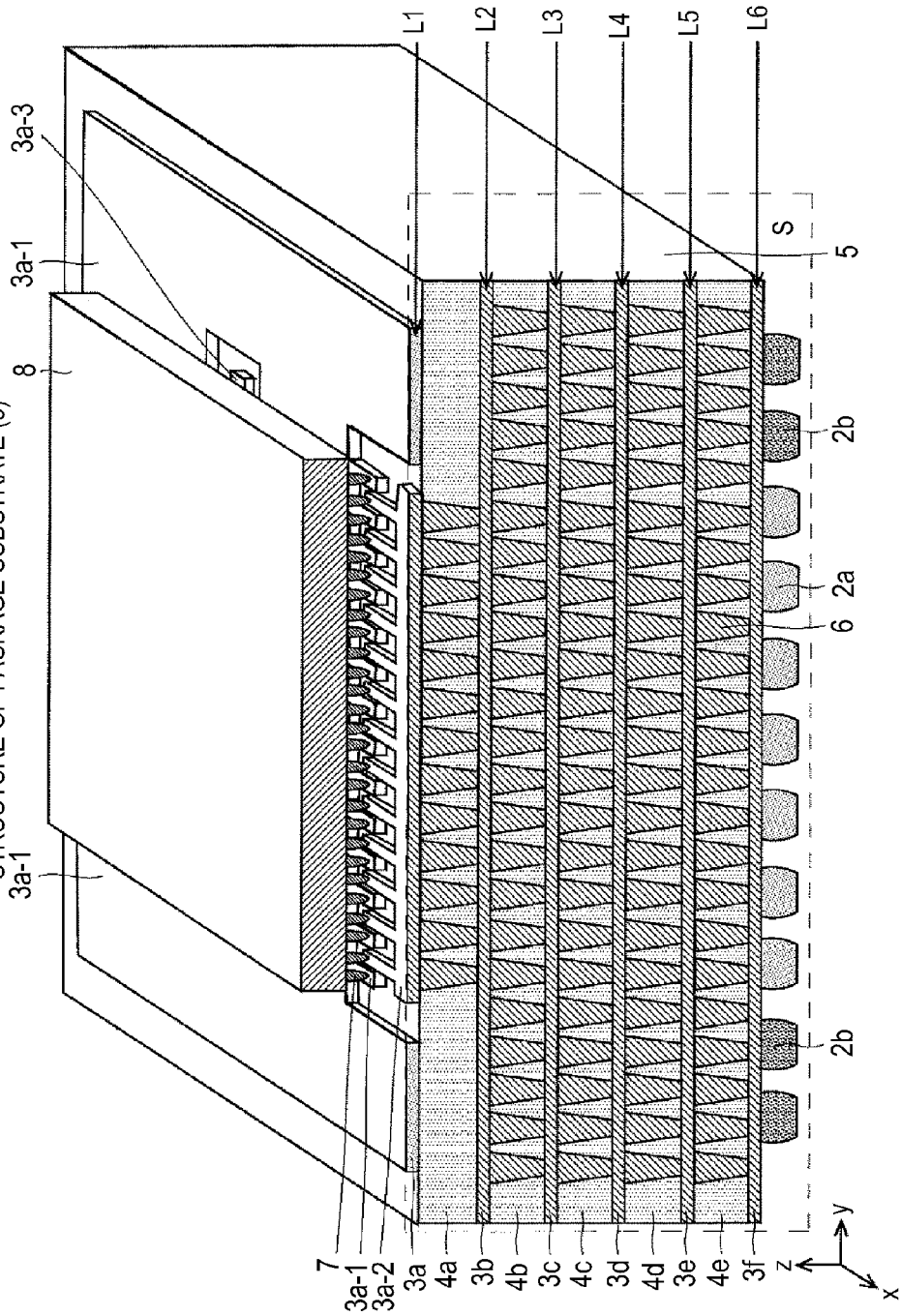
FIG. 10 is a view for explaining a structure of a package substrate (9) according to an embodiment of the present disclosure.
Figure 11:
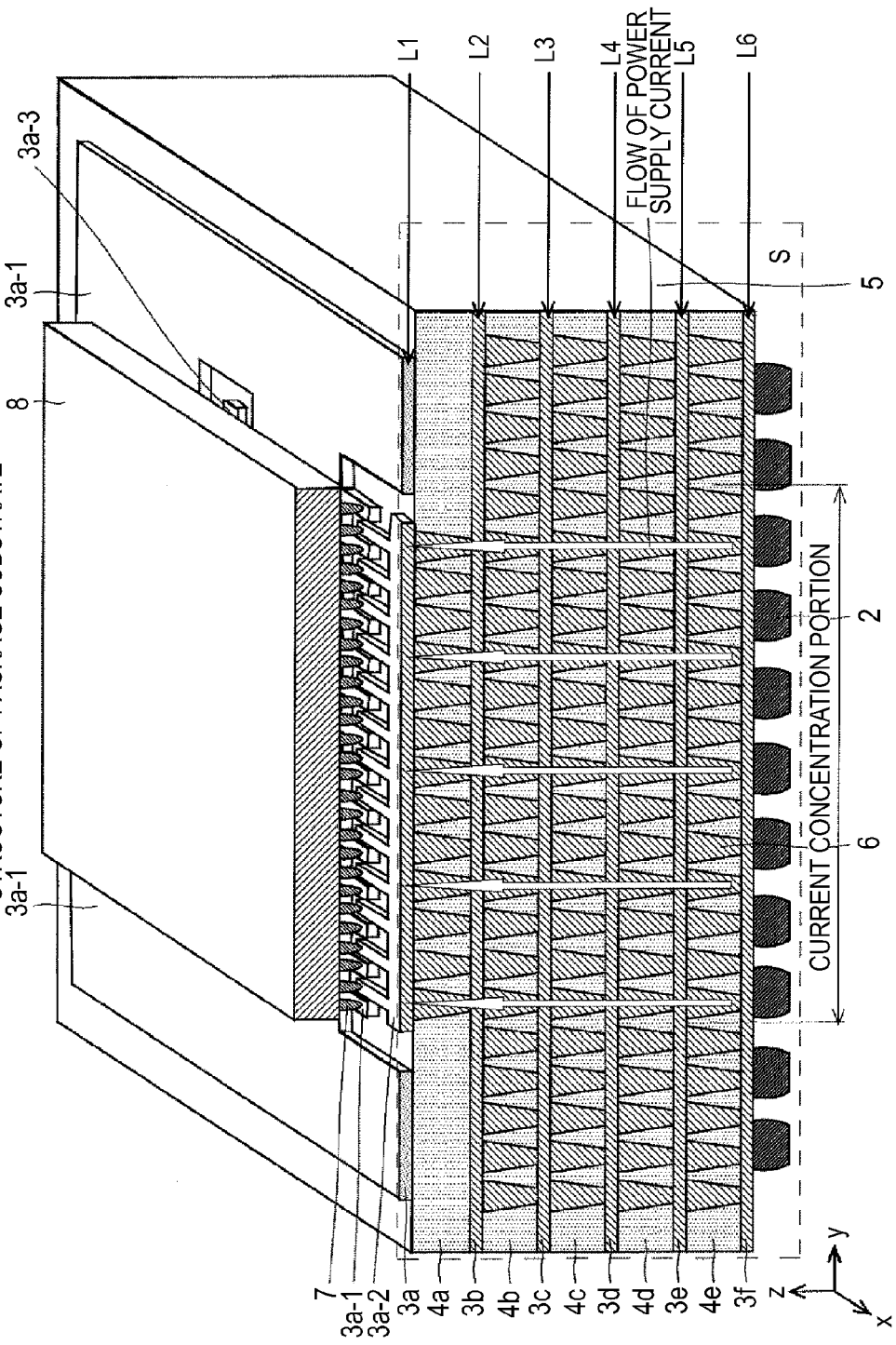
FIG. 11 is a view for explaining a structure of a package substrate in related art.
Figure 12:
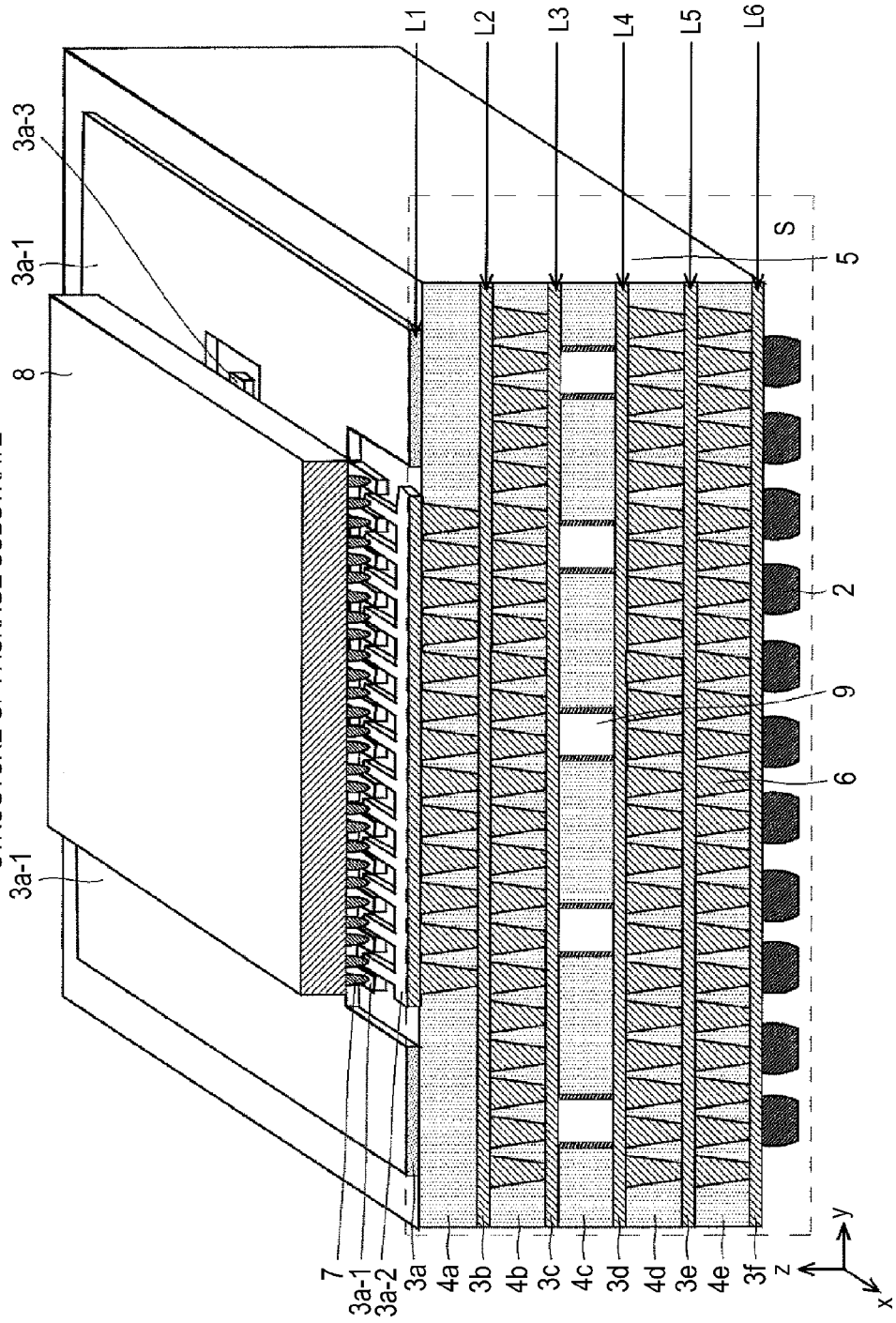
FIG. 12 is a view for explaining a structure of a package substrate in related art.

FIG. 10 is a view for explaining a structure of a package substrate (9) according to an embodiment of the present disclosure, which is a perspective view including a cross-section formed by cutting out part of the semiconductor chip 8 and a view showing a cross-sectional structure of the package substrate 5 shown in the same manner as FIG. 1.

In the package substrate (9), a high-resistance BGA is used as a BGA positioned corresponding to the loading area of the semiconductor chip 8 and a low-resistance BGA is used as a BGA positioned corresponding to the peripheral area outside the loading area in the package substrate (1) shown in FIG. 1.

The high-resistance BGA and the low-resistance BGA can be formed by changing the level (high/low) in conductivity (or high/low in resistivity) of the conductive material for forming the BGA. Conductive materials having high conductivity (or low resistivity) are, for example, copper, silver, gold, chromium and so on, and materials having low conductivity (or high resistivity) are, for example, aluminum, tungsten, molybdenum and so on.

As shown in FIG. 10, the BGA connected to the terminal patterns in the wiring layer 3f (power supply layer) formed in the L6 layer and the terminal patterns of the system board (not shown) are shown, and a high-resistance BGA 2a is arranged in the loading area of the semiconductor chip 8 and a low-resistance BGA 2b is arranged in the peripheral area outside the loading area.

In the example shown in FIG. 10, vias (filled vias in which a conductive material is filled) 6 are used as interlayer connection conductors in the interlayer insulating layers 4a to 4e, and the high-resistance BGA 2a of central 7-rows is arranged in parallel to the x-direction so as to correspond to the loading area of the semiconductor chip 8, and a low-resistance BGA 2b of 2-rows is arranged right and left respectively in parallel to the x-direction so as to correspond to the peripheral area outside the loading area.

According to the structure of the package substrate (9) shown in FIG. 10, the effect of alleviating the current concentration can be obtained in the same manner as in the structure of the package substrate (1) shown in FIG. 1.

<Package Substrate (10)>

A package substrate (10) has a structure in the package substrate (8), namely, the structure in which the high-resistance bump is used as the bump positioned corresponding to the central portion area including the central portion of the loading area of the semiconductor chip 8, and the low-resistance bump is used as the bump positioned corresponding to the peripheral area outside the central portion area including the central portion of the loading area is combined with any of the structures of the interlayer connection conductors in the package substrates (1) to (7).

According to the structure of the package substrate (10) having the above structure, the effect of alleviating the current concentration can be obtained in the same manner as in the structure of the package substrate (1) shown in FIG. 1.

<Package Substrate (11)>

A package substrate 11 has a structure in the package substrate (9), namely, the structure in which the high-resistance BGA is used as the BGA positioned corresponding to the loading area of the semiconductor chip 8, and the low-resistance BGA is used as the BGA positioned corresponding to the peripheral area outside the loading area is combined with any of the structures of the interlayer connection conductors in the package substrates (1) to (7).

According to the structure of the package substrate (11) having the above structure, the effect of alleviating the current concentration can be obtained in the same manner as in the structure of the package substrate (1) shown in FIG. 1.

The structure examples concerning the package substrate for suppressing concentration of power supply current at the time of driving the semiconductor chip 8 have been explained as the above. The same structures as these structure examples are applied to structures concerning the interlayer connection conductors in the interlayer insulating layers between the ground layers, the bump array 7 and the BGA 2, thereby suppressing the concentration of ground current at which the semiconductor chip 8 is driven (though the direction of flowing current will be opposite), which has the same operation and effect as in the above structure examples for suppressing concentration of power supply current.

The embodiments of the present disclosure have been explained as the above, however, the present disclosure is not limited the above embodiments and various modifications may occur based on technical ideas of the present disclosure.

For example, the present disclosure can be carried out without being limited to the number of power supply layers and ground layers of the package substrate and the present disclosure is not limited by the number of power supply layers and ground layers. The present disclosure can be also carried out without being limited to the number of interlayer connection conductors formed so as to pierce through the interlayer insulating layer, the number of bumps in the bump array and the number of conductive balls in the BGA and the present disclosure is not limited by the number of interlayer connection conductors, the number of bumps and the number of conductive balls. Moreover, the BGA can be an LGA (land grid array) in which planar electrodes are two-dimensionally arranged.

According to the embodiments of the present disclosure, the package substrate capable of alleviating large current concentration and a module and electric/electronic devices using the same can be provided.

The present disclosure contains subject matter related to that disclosed in Japanese Priority Patent Application JP 2010-211641 filed in the Japan Patent Office on Sep. 22, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A package substrate comprising:
a first conductive layer having plural first terminal pattern portions connected to a semiconductor part loaded on a first principal surface through plural first external connection conductors, wherein the first conductive layer is disposed on the first principal surface;
a second conductive layer having plural second terminal patterns connected to a system substrate mounted on a second principal surface opposite to the first principal surface through a second external connection conductor, wherein the second conductive layer is disposed on the second principal surface;
an intermediate conductive layer formed between the first conductive layer and the second conductive layer;
a first interlayer insulating layer disposed between the first conductive layer and the intermediate conductive layer;
a second interlayer insulating layer disposed between the second conductive layer and the intermediate conductive layer; and
a first plurality of interlayer connection conductors disposed in the first interlayer insulating layer such that the first plurality of interlayer connection conductors pierce through the first interlayer insulating layer;
a second plurality of interlayer connection conductors disposed in the second interlayer insulating layer such that the second plurality of interlayer connection conductors pierce through the second interlayer insulating layer, wherein the first plurality of interlayer connection conductors and the second plurality of interlayer connection conductors electrically connect the first conductive layer and the second conductive layer, and
wherein a first portion of the first plurality of interlayer connection conductors having high resistance are positioned corresponding to a central portion area of a loading area on which the semiconductor part is loaded and between a second portion of the first plurality of interlayer connection conductors having low resistance positioned corresponding to the peripheral area outside the central portion area, and
wherein the first terminal pattern portions, the first external connection conductors, the first plurality of interlayer connection conductors, the second plurality of interlayer connection conductors, the second terminal pattern portions, and the second external connection conductor are electrically connected forming plural current paths connecting the semiconductor part and the system substrate, and wherein current paths positioned corresponding to a central portion area of a loading area on which the semiconductor part is loaded have high resistance and current paths positioned corresponding to a peripheral area outside the central portion area have low resistance.

2. The package substrate according to claim 1, wherein power supply current at which the semiconductor part is driven flows in the current paths.

3. The package substrate according to claim 1, wherein ground current at which the semiconductor part is driven flows in the current paths.

4. The package substrate according to claim 1, wherein the current paths having high resistance comprise interlayer connection conductors having high resistance and the current paths having low resistance comprise interlayer connection conductors having low resistance.

5. The package substrate according to claim 4, further comprising plural intermediate conductive layers, wherein interlayer insulating layers are formed between adjacent intermediate conductive layers.

6. The package substrate according to claim 5, wherein the same interlayer insulating layer is the interlayer insulating layer of the second layer counted from the side of the first conductive layer.

7. The package substrate according to claim 5, wherein the plural intermediate conductive layers include interlayer connection conductors positioned corresponding to the loading area and having high resistance and the plural intermediate conductive layers include interlayer connection conductors positioned corresponding to the outside area and having low resistance in part or all of the interlayer insulating layers.

8. The package substrate according to claim 7, wherein the plural connection conductors positioned corresponding to the loading area have high resistance and the plural interlayer connection conductors positioned corresponding to the outside area have low resistance in at least one interlayer insulating layer counted from the side of the first conductive layer.

9. The package substrate according to claim 5, wherein
the number of the connection conductors having high resistance is increased as the layer number of interlayer insulating layers is increased when counting the layer number of the interlayer insulating layers is counted from the side of the first conductive layer.

10. The package substrate according to claim 4, wherein the interlayer connection conductors positioned corresponding to the loading area and the interlayer connection conductors positioned corresponding to the outside area are made of conductive materials having different resistances.

11. The package substrate according to claim 4, wherein the plural interlayer connection conductors stacked for connecting between the first conductive layer and the second conductive layer are formed to have a stacked via structure.

12. The package substrate according to claim 4, wherein the interlayer connection conductors comprise at least one of filled vias, hollow vias or through holes in the same interlayer insulating layer.

13. The package substrate according to claim 12, wherein the interlayer connection conductors positioned corresponding to the loading area and the interlayer connection conductors positioned corresponding to the outside area have different diameters.

14. The package substrate according to claim 13, wherein the interlayer connection conductors are the hollow vias or the through holes, and
the interlayer connection conductors positioned corresponding to the loading area and the interlayer connection conductors positioned corresponding to the outside area have walls having different plating thicknesses.

15. The package substrate according to claim 1,
wherein the second external connection conductor positioned corresponding to the loading area has high resistance and the second external connection conductor positioned corresponding to the peripheral area outside the loading area has low resistance, and
the current paths positioned corresponding to the loading area have high resistance and the current paths positioned corresponding to the peripheral area outside the loading area have low resistance.

16. The package substrate according to claim 1,
wherein the first external connection conductors positioned corresponding to the central portion area have high resistance and the first external connection conductors positioned corresponding to the peripheral area outside the central portion area have low resistance, and
the current paths positioned corresponding to the central portion area have high resistance and the current paths positioned corresponding to the peripheral area outside the central portion area have low resistance.

17. A module comprising:
the package substrate according to claim 1.

18. An electric/electronic device comprising:
the package substrate according to claim 1.

* * * * *